(12) United States Patent
Hauhe et al.

(10) Patent No.: US 7,298,235 B2
(45) Date of Patent: Nov. 20, 2007

(54) CIRCUIT BOARD ASSEMBLY AND METHOD OF ATTACHING A CHIP TO A CIRCUIT BOARD WITH A FILLET BOND NOT COVERING RF TRACES

(75) Inventors: Mark S. Hauhe, Hermosa Beach, CA (US); Kevin C. Rolston, Playa Del Rey, CA (US); Clifton Quan, Arcadia, CA (US); Harold S. Fenger, Thousand Oaks, CA (US); Tse E. Wong, Los Alamitos, CA (US)

(73) Assignee: Raytheon Company, Waltham, MA (US)

( * ) Notice: Subject to any disclaimer, the term of this patent is extended or adjusted under 35 U.S.C. 154(b) by 692 days.

(21) Appl. No.: 10/756,649

(22) Filed: Jan. 13, 2004

(65) Prior Publication Data

US 2005/0151215 A1    Jul. 14, 2005

(51) Int. Cl.
    *H01P 1/00*    (2006.01)
(52) U.S. Cl. .................................. 333/247; 257/778
(58) Field of Classification Search ............... 333/247; 257/778
    See application file for complete search history.

(56) References Cited

U.S. PATENT DOCUMENTS 5,493,305 A    2/1996    Wooldridge
5,801,447 A    9/1998    Hirano
5,880,694 A    3/1999    Wang et al.
6,998,709 B2 *    2/2006    Khorram .................... 257/728
2002/0053735 A1 *    5/2002    Neuhaus et al. ............ 257/728
2004/0036179 A1 *    2/2004    Chiu et al. .................. 257/778
2004/0041282 A1    3/2004    Kinsman

OTHER PUBLICATIONS

NASA Earth Science Technology Conference 2003, Day Two Detail—Jun. 25, 2003 (2 pages) http://esto.nasa.gov/conferences/estc2003/sessions2.html.
CYCLOTENE TM 4000 Series, Advanced Electronic Resins (Photo BCB), Revised: May 3, 1999.
EP 1 146 593 A (NEC Corporation) Oct. 17, 2001 abstract, paragraph 0143-paragraph 0160; figures 1-4, 9A-D.
EP 0 977 253 A (Texas Instruments Inc.), Feb. 2, 2000 abstract; figures 7,8.
Patent Abstracts of Japan, vol. 1999, No. 07, Mar. 31, 1999 & JP 08 017498 A (Ind. Tech. Res. Inst.) Jan. 19, 1998 91996-01-19) abstract.

* cited by examiner

Primary Examiner—Benny Lee
(74) Attorney, Agent, or Firm—Leonard A. Alkov (57) ABSTRACT

An antenna array is assembled by direct attaching a flip chip transmit/receive (T/R) module to an antenna circuit board. A fillet bond is applied to the circuit board and the flip chip T/R module around at least a portion of the periphery of the flip chip T/R module.

18 Claims, 6 Drawing Sheets

CIRCUIT BOARD ASSEMBLY AND METHOD OF ATTACHING A CHIP TO A CIRCUIT BOARD WITH A FILLET BOND NOT COVERING RF TRACES

BACKGROUND OF THE DISCLOSURE

Chips can be attached to a circuit board. For example, antenna arrays can be assembled using packaged transmission/receive (T/R) modules. Packaged module assemblies may be brick array or coplanar tile arrays. Such packaged assemblies may include fasteners, interconnect structures and connectors, including, for example, coaxial cable, "fuzz" buttons, ribbon and/or wire bonds. Such packages and connecting structures contribute to increased weight and bulk of the assembly and increase the amount of board area used. Assembly may also require numerous steps which contribute to the time and cost of manufacture.

SUMMARY OF THE INVENTION

An antenna array is assembled by a method which includes direct attaching a flip chip transmit/receive (T/R) module to an antenna circuit board. A fillet bond is applied to the circuit board and the flip chip T/R module around at least a portion of the periphery of the flip chip T/R module.

BRIEF DESCRIPTION OF THE DRAWINGS

These and other features and advantages of the invention will readily be appreciated by persons skilled in the art from the following detailed description of an exemplary embodiment thereof, as illustrated in the accompanying drawings, in which.

DETAILED DESCRIPTION OF THE INVENTION

In the following detailed description and in the several figures of the drawing, like elements are identified with like reference numerals and which may not be described in detail in all drawing figures in which they appear.

Figure 1:
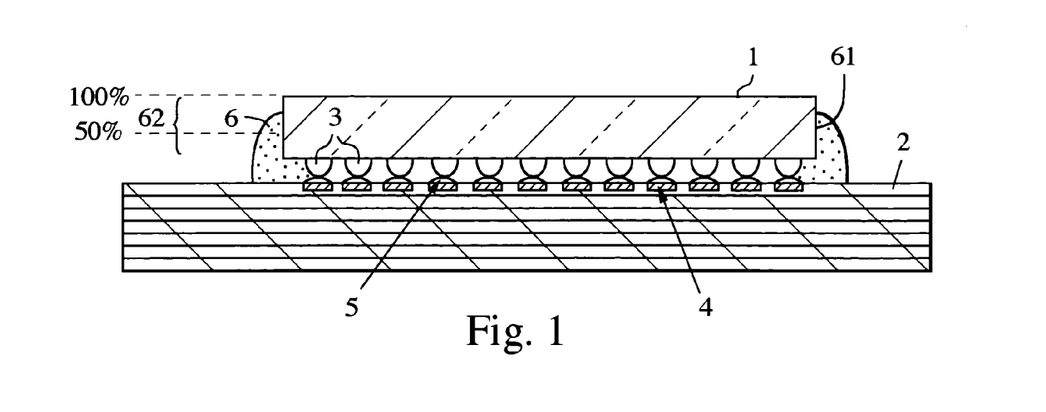
FIG. 1 illustrates an exemplary embodiment of a chip attached to a circuit board.

FIG. 1 illustrates an exemplary embodiment of a chip 1 connected to a circuit board 2. In the exemplary embodiment FIG. 1, the chip 1 is a transmit/receive (T/R) device chip 1 connected to a circuit board 2. In the embodiment illustrated in FIG. 1, the circuit board 2 is a multi-layer antenna panel circuit assembly. The multi-layer antenna panel circuit assembly may be flexible or rigid. In alternate embodiments, the chip 1 could be a receive chip or any other chip suitable for attaching to a circuit board. The circuit board could be any circuit board suitable for attaching chips. The circuit board 2 is a medium for distributing power, RF, and digital signals. The RF signals may be distributed to an antenna array which could be on the circuit board or attached to the circuit board.

The T/R chip is a "flip chip" with connecting portions or "bumps" 3 arranged on the underside of the chip 1 for connection to corresponding contact pads 4 on the upper surface of the circuit board 2. The chip 1 has been connected to the circuit board 2 by a flip chip or direct chip attach process. The bumps 3 are connected to the contact pads 4 by a conductive medium 5. The connections may comprise microwave, RF, analog, digital and/or DC power interconnections between the chip 1 and the circuit board 2. In an exemplary embodiment, the chip 1 may operate at microwave or RF frequencies up to at least 11 Ghz. The chip may comprise an RF T/R chip or T/R module and may comprise, for example, an SiGe T/R chip 1.

The bumps 3 may comprise solder or solder alloys, for example tin lead or indium lead alloys. The contact pads may comprise a conductive material, for example metal which may be plated copper. In an alternate embodiment, bumps could be on the circuit board and contact pads could be on chips. The bumps 3 and RF traces on the board (not shown) may be placed over a dielectric layer, for example bisbenzo-cyclo-butene (BCB). In an exemplary embodiment, the dielectric layer can be, for example, one of the CYCLOTENE™ 4000 Series electronic resins (photo BCB), which is available from Dow. BCB may be spun onto the chip in a liquid state at the wafer level and cured. The bumps 3 and RF traces on the chip are placed on top of the dielectric layer to reduce RF losses and reduce mechanical stress at the bumped interconnect when the devices are attached.

In the exemplary embodiment of FIG. 1, the conductive medium 5 may comprise solder or electrically conductive adhesive (ECA), for example epoxy resin loaded with silver particles. In other exemplary embodiments, the conductive medium may comprise anisotropically conductive film 51 (ACF) (FIG. 7) and may be connected using pressure or thermosonic contact 52 (FIG. 8). Any other suitable electrically conductive medium or media for connecting bumps 3 of a chip 1 to a circuit board 2 could alternatively be used.

In FIG. 1, a fillet bond 6 is placed around at least a portion of the chip 1, for example around a portion of the periphery of the chip 1, for bonding the chip 1 to the circuit board 6. The fillet bond may comprise non-conductive and/or high viscosity adhesive and/or may comprise epoxy, for example silica-loaded epoxy with a viscosity of about 4000 centapoise. The bond 6 may comprise material which has a high flexure modulus, for example about 42 giga-pascals (Gpa), for holding the chip 1 substantially rigidly to the circuit board 2. In the exemplary embodiment of FIG. 1, the fillet bond 6 is attached at least to a portion of the sidewall 61 of the chip 1. The bond 6 extends up the sidewall 61 of the chip as far as 50% to 100% of the thickness of the chip 1. In an alternate embodiment, the bond 6 could extend less than 50% of the thickness 62 of the chip sidewall 61. In an exemplary embodiment, the fillet bond 6 extends up the sidewall 61 to about at least ⅔ of the thickness 62 of the chip 1.

The bond 6 may extend at least partially into the space between the chip 1 and the circuit board 2. For example, in the exemplary embodiment of FIG. 1, the bond 6 extends between the chip 1 and the circuit board 2 and touches at least the outer edges of the bumps 3, without extending beyond the bumps 3. The material used for the fillet bond 6 may be selected to provide some control of localized coefficient of thermal expansion (CTE) mismatch which could weaken the solder joints. The bond material touches the solder joint and reduces the solder mismatch. The fillet bond material may be selected to have desirable strength, sufficiently high flexural modulus and to be CTE matched with the chip. In some embodiments, the bond 6 may extend around the entire edge or perimeter of the chip. A T/R chip 1 with bumps 3 for making connections to contact pads 4 of an antenna circuit board 2 can be connected to the circuit board 2 without a package for housing connection structures. The electrical connections can be made through the conductive medium connecting the bumps 3 to the pads 4 and the chip can be secured to the circuit board by the conductive medium, a fillet bond and/or underfill, without any other connecting or securing structures.

Figure 2:
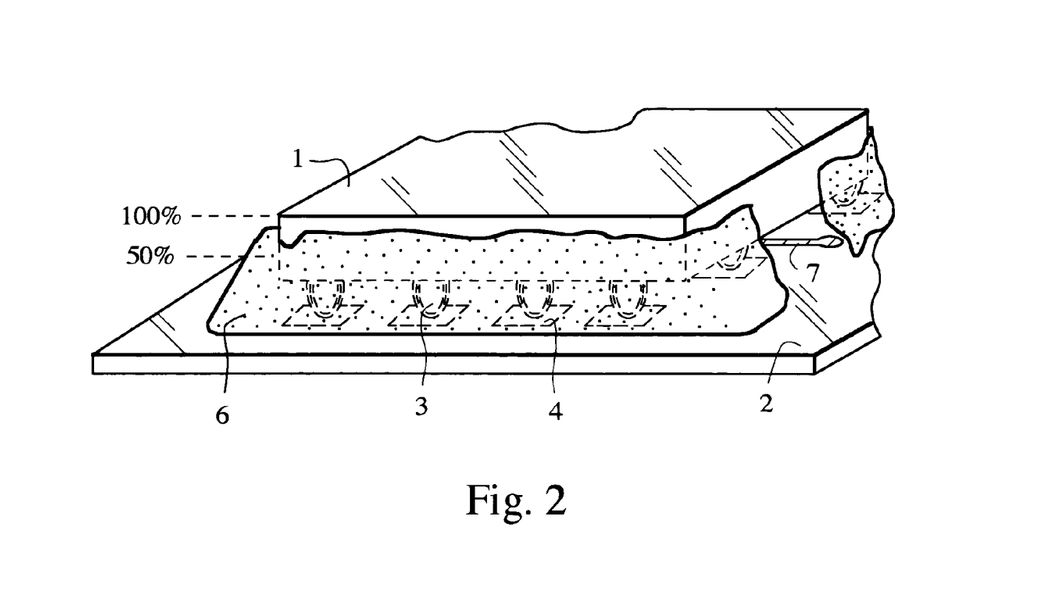
FIG. 2 illustrates an exemplary embodiment of a chip attached to a circuit board.

FIG. 2 illustrates an exemplary embodiment of a circuit board 2 with a chip 1 attached. A fillet bond 6 extends around at least a portion of the chip 1. In the exemplary embodiment of FIG. 2, the fillet bond 6 is not applied to the area on the circuit board 2 where microwave or RF signal traces 7 extend out from under the chip 1. The bond 6 may be applied around the perimeter of the chip 1 in areas where there are no microwave/RF traces. Not placing the fillet bond 6 over RF traces 7 may be particularly suitable for applications with frequencies above 6 GHz and/or in applications in which degradation in RF signals in RF traces 7 covered by dielectric material is not desirable. The degradation of signals can be caused by the difference in the dielectric constant of the epoxy as compared to the empty space or air over an uncovered RF trace.

Figure 3:
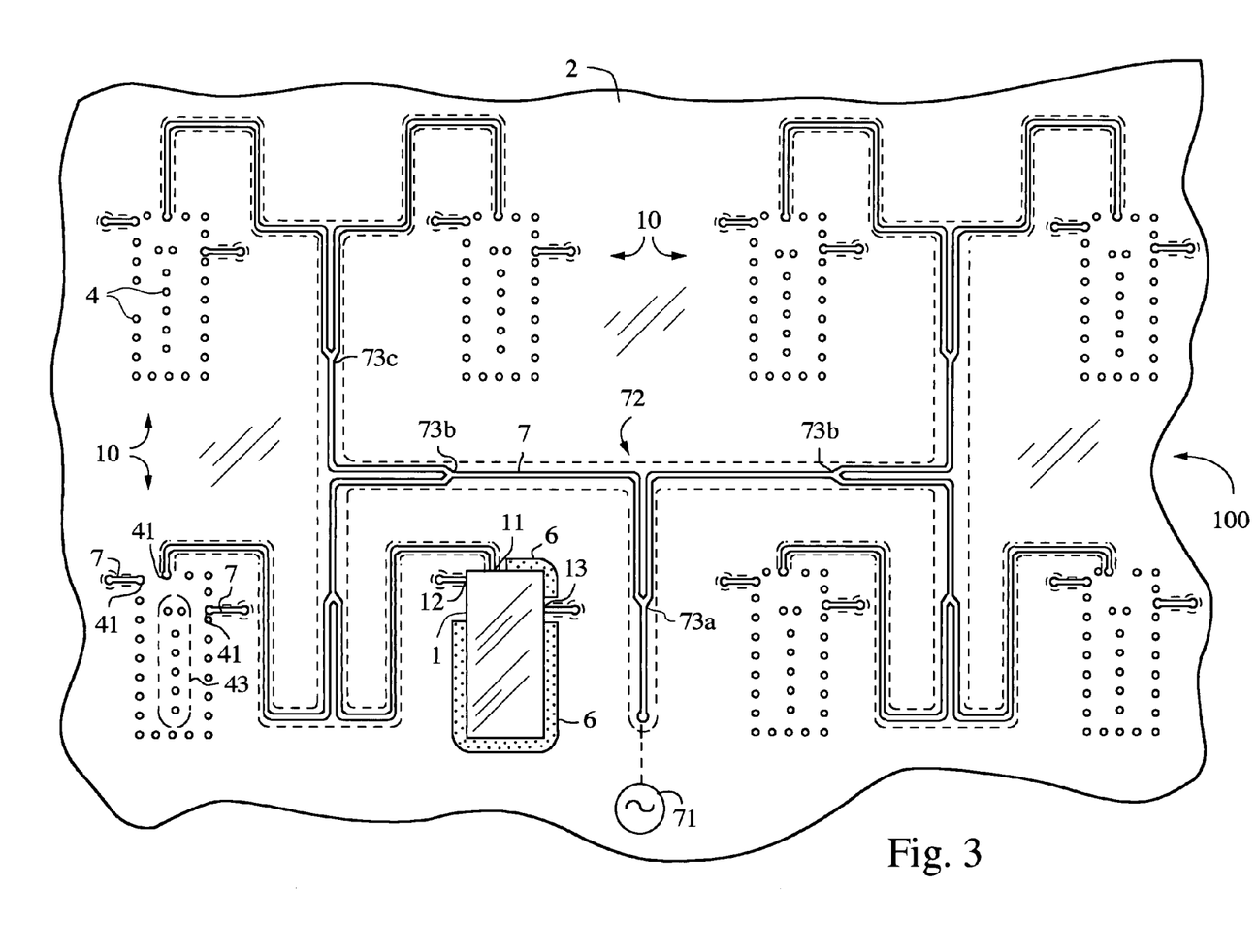
FIG. 3 illustrates an exemplary embodiment of a circuit board with an array of chip locations and a chip attached to the circuit board at a chip location.
Figure 4:
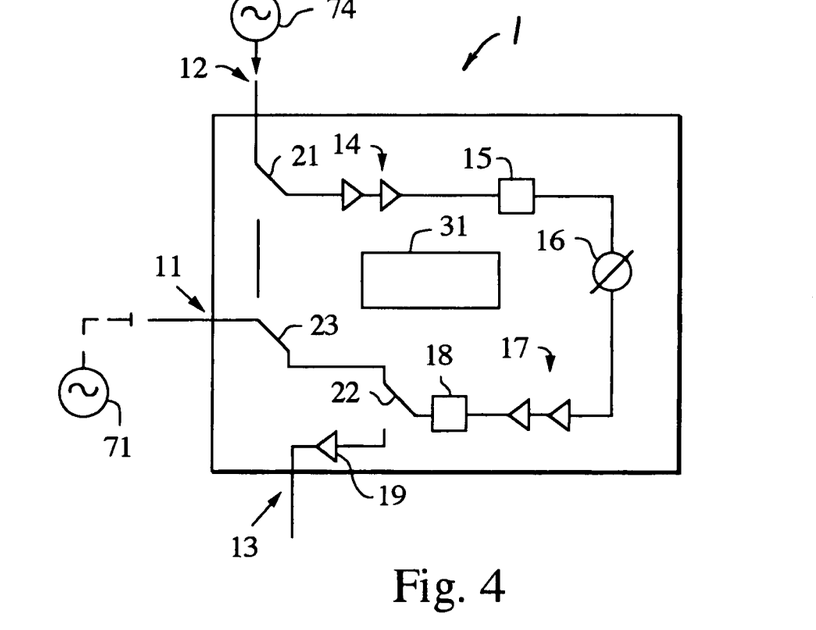
FIG. 4 illustrates a schematic circuit diagram of an exemplary embodiment of a T/R chip.

FIG. 3 illustrates an exemplary embodiment of a circuit board 2 with a chip 1 attached at one of a plurality of chip locations 10. A fillet bond 6 extends around at least a portion of the chip 1 where there are no microwave/RF traces 7. At each chip location 10, contact pads 4 are arranged on the circuit board 2 in a pattern corresponding to the pattern of bumps 3 (FIG. 1) on a surface of the chip 1. The bumps and the contact pads 4 are arranged to make appropriate microwave, RF, analog, digital and/or DC power interconnections between the chip 1 and the circuit board 2. The chip locations 10 are arranged on the board 2 so that the chips 1 form an array 100 of chips when attached. An RF signal 71 is input from an array beam forming network radar receiver/exciter to RF traces 7 on the circuit board 2. Some of the RF traces 7 may form a dividernetwork 72. In the exemplary embodiment of FIG. 2, the RF signal 71 is divided through a 1:8 power divider network 72 comprising 7 1:2 power dividers 73a, 73b and 73c. The array 100 shown in FIG. 3 may comprise a sub-array of a larger array (not shown). In an exemplary embodiment, the array could be as large as hundreds of square meters. RF signal traces 7 connect to RF contact pads 41. Signal traces 7 from the divider network 72 connect to at least one of the RF contact pads 41 at each chip location 10 which corresponds to a bump (not shown) on the chip 1 for connecting to a beam forming port (BMF port) 11 of the chip 1. RF traces 7 may also attach to RF contact pads 41 corresponding to bumps (not shown) on the chip 1 for connecting to the low noise amplifier (LNA) port 12 and a high power amplifier (HPA) port 13 of the chip 1 (FIG. 4).

In an exemplary embodiment, the TR chip 1 of FIG. 3 may operate in the receive mode at a frequency range of between 7-11 Ghz, a gain of 9.0 dB, 5 bit variable attenuation, and 6-bit variable phase. In the transmit mode, it may operate in a frequency range of 7-11 Ghz, with a gain of 17.0 dB, power out of 20.0 dBm (power in=3 dBm), 5 bit variable attenuation and 6 bit variable phase. Some of the contact pads 4 may comprise pads 4 for connecting bumps on the chip 1 corresponding to ground or to various application specific integrated circuit (ASIC) functions performed by the controller 31 (FIG. 4). In the exemplary embodiment of FIG. 3, for example, a group of interior contact pads 43 correspond to bumps on a T/R chip for connecting the T/R chip to ground. Other contact pads 4 may also connect the T/R chip to ground.

The chip 1 may comprise a "common leg" circuit. In the exemplary embodiment of FIG. 4, for example, the chip 1 comprises three RF signal ports, namely a BMF port 11, an LNA port 12 and an HPA port 13. The LNA port is switchably connected through transfer switch 21 to a forward gain amplifier 14, a first attenuator 15, a phase shifter 16, a reverse gain amplifier 17 and a second attenuator 18. The gain amplifiers 14 and 17 may comprise two-stage hetero-bipolar-transistor (HBT) gain amplifiers. In the receive mode, a signal 74, for example from array radiating element, is input through the LNA port, processed through the gain amplifier 14, attenuator 15, phase shifter 16, gain amplifier 17, attenuator 18 through a switch 22 and switch 23 to the BMF port. In a transmit mode, a signal 71 is input from the beam steering network to the BMF port 11, which connects through the switches 23 and 21 (both switched to positions which are not shown) to the gain amplifier 14, attenuator 15, phase shifter 16, gain amplifier 17, attenuator 18, switch 22 (switched to a position which is not shown) to the driver amplifier 19 and HPA port 13 to the radiating element of a radar array. The drive amplifier 19 may comprise a single-stage drive amplifier outside of the "common leg" circuit. The chip 1 may also comprise a digital/analog controller 31. The controller 31 may perform application specific integrated circuit (ASIC) functions. The switches 21, 22, 23 may comprise pin diode, FET or MEM switches.

Figure 5:
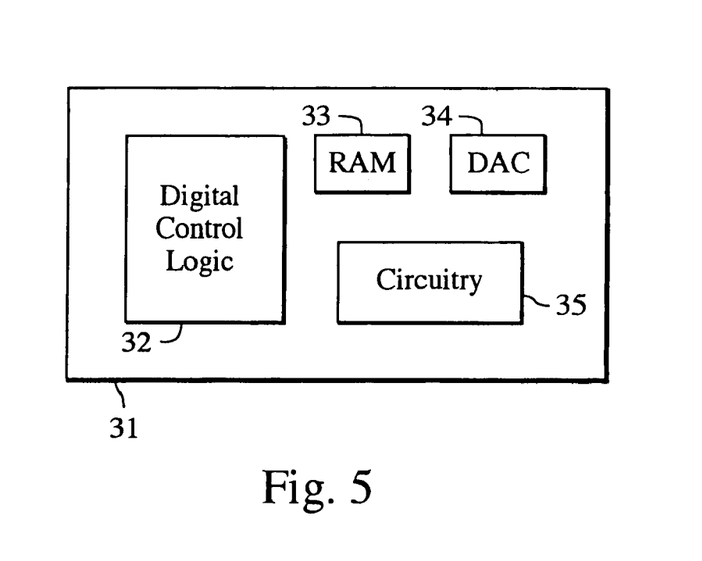
FIG. 5 illustrates a functional block diagram of a controller of a T/R chip.

FIG. 5 illustrates an exemplary embodiment of a functional block diagram of a controller 31 of a T/R chip and exemplary ASIC functions performed by the controller 31. The ASIC functions may comprise digital control logic 32, random access memory (RAM 33), circuitry 35 or digital-to-analog converter (DAC) 34. The digital control logic 32 may support word recognition, reception broadcast and module specific control words, current and next beam registered data for RF control, detection of faults to asynchronous communication, RAM based multi-beam registering, driving two different types of phase shifters and/or may provide negligible power dissipation in a standby mode. The RAM 33 may comprise storage of volatile multiple beam data for beam steering. The circuitry 34 may comprise, for example, a 0.3 mW line receiver, a 0.5 mW variable voltage switch control for LNA bias, base controlled amplifier bias circuits, pin diode drivers. The DAC may comprise, for example, voltage settings for linearly biasing a varactor phase shifter, with, for example, 8 bits of control to select 255 voltage states. Connections between these functions and corresponding functions of the circuit board may be made by flip chip or direct chip attachment of the chip or module to a circuit board. In FIG. 1, for example, appropriate bumps 3 on the chip are connected to corresponding contact pads 4 on the circuit board 2 by conductive media 5.

Figure 6:
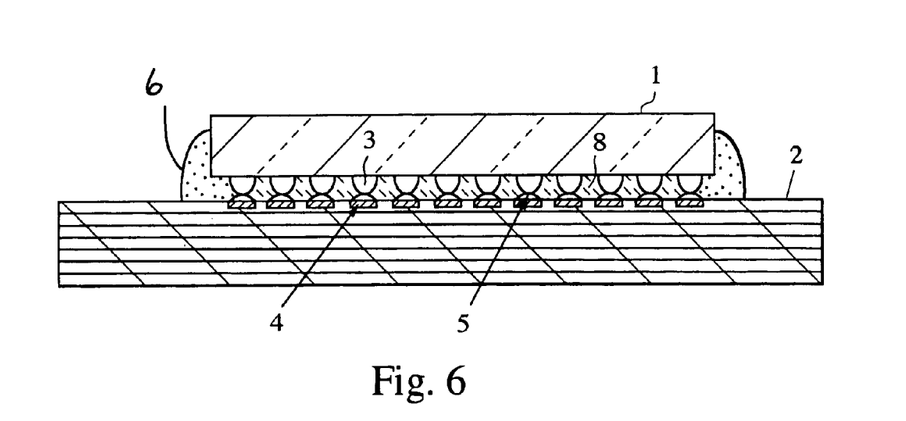
FIG. 6 illustrates an exemplary embodiment of a chip attached to a circuit with an underfill.

In certain exemplary embodiments, the chip 1 may be underfilled. FIG. 6, for example, illustrates an exemplary embodiment of a chip 1 attached to a circuit board 2. Bumps 3 on the chip 1 may be attached to contact pads 4 on the board 2 by solder or ECA 5. A fillet bond 6 is attached to at least a portion of the of the chip 1. Underfill 8 is located between the chip and the circuit board. The underfill 8 may comprise an epoxy, for example heavily filled or loaded (with silica) or reworkable epoxy. In an exemplary embodiment, the epoxy can be loaded by as much as 60%. In alternate embodiments, the underfill may comprise silicon rubbers, urethanes, silicones, and/or polymers. In an exemplary embodiment, the circuit board 2 is first warmed. A bead of epoxy is dispensed through a needle onto the circuit board 2 around the perimeter of an attached chip 1. As the circuit board 2 cools, the epoxy is drawn under the chip 1, into the spaces between the chip 1 and the circuit board 2, by capillary action. In an exemplary embodiment, the underfill encapsuiates the bumps 3.

Underfill 8 may be used, for example, in applications in which the RF signals do not experience undesirable degradation from contact with the underfill material. Epoxy, for example, may degrade RF signals at frequencies higher than about 6 GHz. Where signal degradation is not an issue, the underfill can be applied without avoiding RF traces. The underfill 6 may fill up or nearly fill up the entire space between the chip 1 and the circuit board 2.

In other exemplary embodiments, partial underfill may be used. The underfill may be applied such that it does not fill the entire space between the chip and the circuit board. For example, in applications in which it is desirable not to cover the RF traces with underfill, the underfill may be selectively placed in a location and in an amount such that it does not cover RF traces when the chip is attached to the circuit board. Partial underfill may be used in applications in which it is desirable to avoid covering the RF traces an in applications in which the RF traces may be covered. Automated x/y placement equipment can control the needle to selectively place the underfill 6 where it will not cover RF traces. Underfill can be used where the conductive medium comprises ECA, solder, pressure and/or thermosonic connections.

Figure 7:
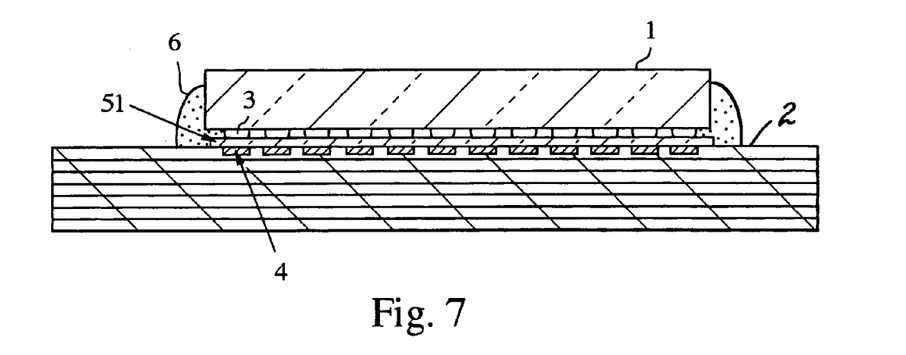
FIG. 7 illustrates an exemplary embodiment of a chip attached to a circuit.
Figure 8:
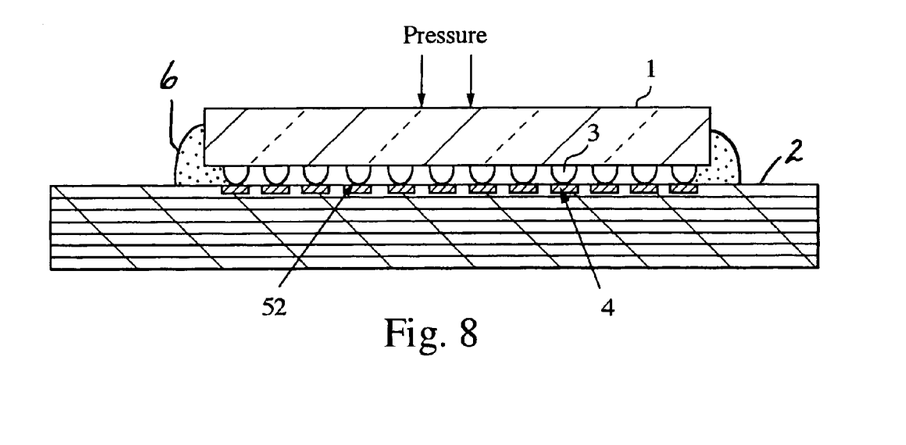
FIG. 8 illustrates an exemplary embodiment of a chip attached to a circuit.

FIG. 7 illustrates an exemplary embodiment of a chip 1 attached to an antenna array circuit board 2 by ACF 51. A fillet bond 6 is provided around at least a portion of the chip 1. FIG. 8 illustrates an exemplary embodiment of a chip 1 with solder bumps 3 attached to an antenna array circuit board 2. The solder bumps 3 are connected to the contact pads 4 by either a pressure or a thermosonic contact 52. In a thermosonic contact, the bumps 3 of the chip 1 are held against the contact pads 4 on the circuit board 2 and subjected to ultrasonic vibrations which can cause the bumps to form a bond with the contact pads 4. A fillet bond 6 is provided around at least a portion of the chip 1.

Figure 9:
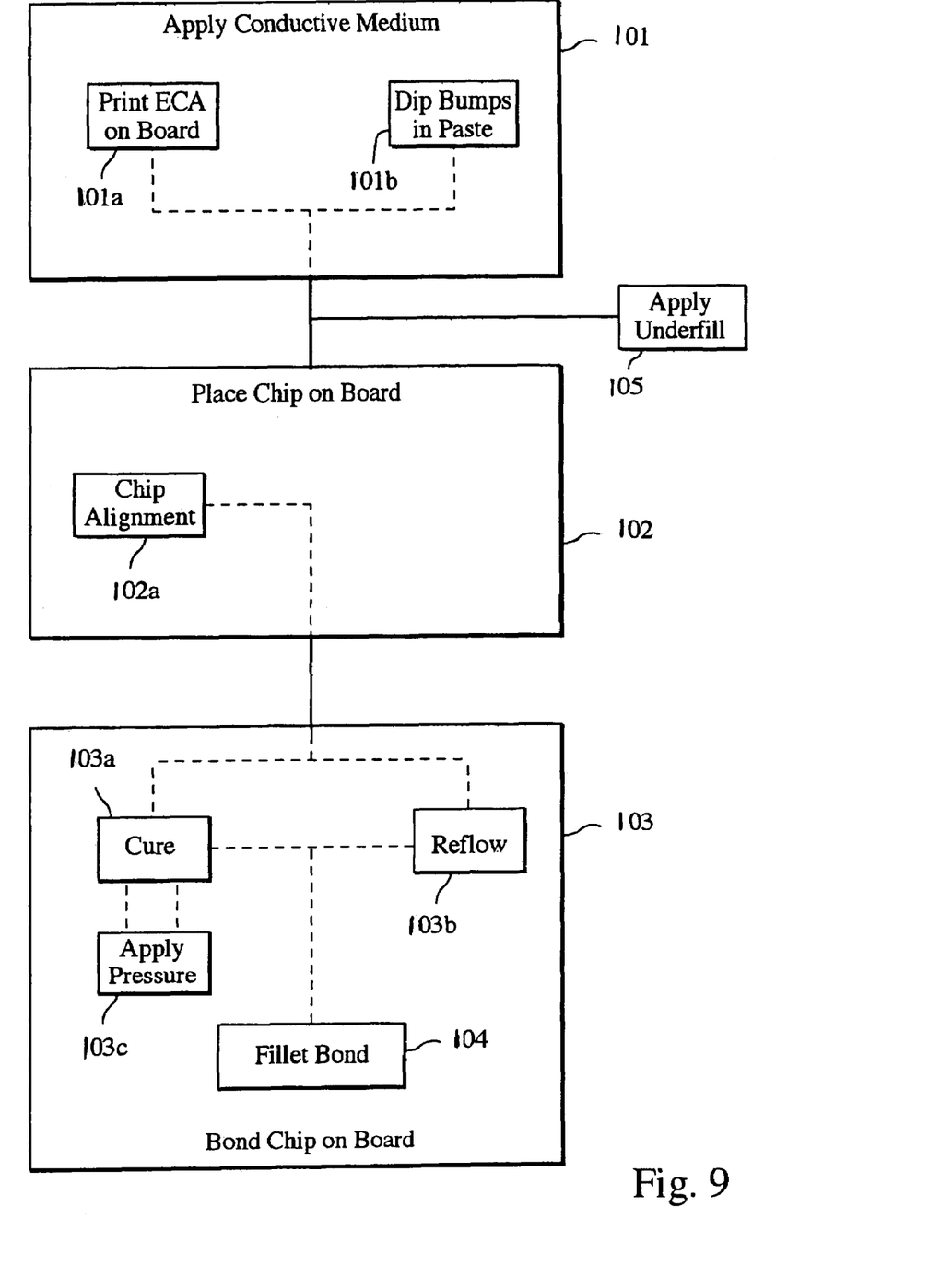
FIG. 9 illustrates an exemplary embodiment of a method of assembling an array of T/R chips to an antenna panel.

In various exemplary embodiments, the conductive medium may be applied by a variety of methods. FIG. 9, for example, illustrates a block flow diagram of an exemplary method of assembling an array of T/R chips on an antenna circuit board. The method illustrated in FIG. 9 includes applying a conductive medium 101, placing the chip on a board 102 and bonding the chip to the board 103. Applying the conductive medium may comprise at least one of applying the conductive medium to contact pads of a circuit board or applying a conductive medium to a chip, for example to the bumps of a T/R chip. Applying a conductive medium may comprise, for example, screen printing a medium 101*a* for example ECA, directly onto a flexible circuit board or dipping the bumps of a chip into a paste 101*b*. Dipping the bumps of a chip into past 101*b* may be performed using a pick and place machine. Any other suitable means for applying the conductive medium may be used without departing from the scope of this invention.

The method illustrated in FIG. 9 also comprises placing the chip 102 on the circuit board. The chips may be placed onto a circuit board automatically by a pick and place machine. In an exemplary embodiment, the pick and place machine may be used to dip the bumps of a chip into paste 101*b* and then to place the chip 102 onto the circuit board. Directly attaching T/R modules to a flexible circuit array may provide a low profile, lower weight alternative to other assembly methods. It may also provide shorter interconnect paths and permit automated assembly of active arrays using commercially available pick and place equipment. Pick and place equipment is available, for example, from Universal Instruments Corp. of Binghamton, New York. In an exemplary embodiment, placing the chip 102 may comprise aligning the chip 102*a* with the circuit board using, for example, a vision system and fiducials located at least on the chip and the circuit board.

After placing the chip 102 in the desired location, the conductive medium may be bonded 103 to the board. Bonding to the board may comprise curing 103*a*, for example ECA, or reflowing 103*b*, for example solder, in an oven or belt furnace, depending on the conductive medium being used. In alternative, exemplary embodiments, bonding the chip to the board may comprise applying pressure 103*c*. Applying pressure 103 may be used during a cure 103*a*, for example, where the conductive medium comprises an anisotropically conductive adhesive or pressure/thermosonic contact. In an exemplary embodiment, bonding the chip to the board may also comprise application of a fillet bond 104 and or underfill 105.

The assemblies and assembly methods described herein may be applied to large-scale flexible antenna circuit panels. Large-scale flexible antenna circuits may be fabricated using reel to reel flexible manufacturing processes, which may allow the manufacture of large flexible panels with sizes of several square feet. Antenna arrays may be as large as 10 square meters or more. Individual flexible panels may have a width of up to about a meter wide. The maximum width of the individual panels forming an assembly may be limited by the size of the pick and place machines available for use in placing chips on circuit boards.

Figure 10:
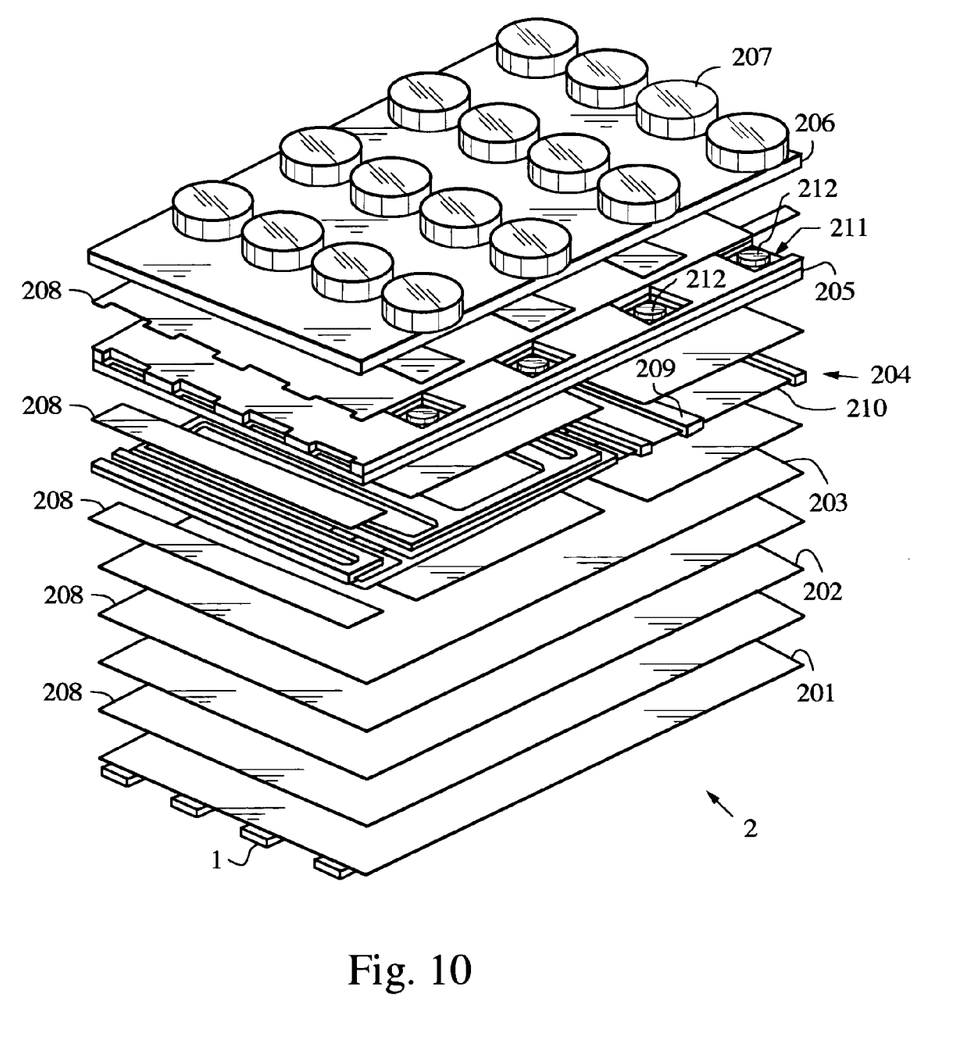
FIG. 10 illustrates an exploded perspective view of an exemplary embodiment of a panel of a flexible antenna circuit board.

FIG. 10 illustrates an exploded perspective view of an exemplary embodiment of a panel of a flexible antenna circuit board 2. The circuit board 2 comprises a circuit film layer 201 with T/R chips 1 attached to the bottom side, a signal/power circuit film layer 202, a bottom-side ground plane layer 203, an air strip line secondary feed layer 204, a circulator mounting board 205 and a strip line circuit board 206 with disk aperture radiating elements 207 mounted on the top-side. In this exemplary embodiment, each layer is separated from adjoining layers by a layer of adhesive 208. The secondary feed layer comprises z-axis gasket layers 209, top and bottom, with circuit film 210, e.a. KAPTON™ polyimide film. The circulator mounting board 205 comprises pockets 211 which enclose three-port circulators 212.

The assemblies and assembly methods described herein may provide for higher density antenna arrays with lighter weight interconnect structures, when compared to other assemblies or assembly methods. Higher density and lighter weight assemblies may be used, for example, in space based radar antenna and "smart skin" avionics applications, in which flexible circuit boards are applied in a conformal manner over the body or skin of the platform, or any other applications. The assemblies and assembly methods described herein may provide interconnect structures for simultaneous microwave, digital and DC power interconnections, as well as structural attachments, between T/R modules and/or flexible circuit panel array antennas, without the bulk or weight associated with other assemblies or assembly methods.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. An assembly comprising:
   a chip;
   a flip chip connection connecting the chip to a circuit board, wherein the circuit board comprises RF traces, wherein the flip chip connection comprises at least an RF connection, a DC power connection and a digital connection;
   a fillet bond connected to the circuit board and the chip around at least a portion of the chip, and wherein the fillet bond does not cover any portion of any of the RF traces.

2. The assembly of claim 1, wherein the chip is a T/R module.

3. The assembly of claim 1, wherein the circuit board comprises a multi-layer flexible antenna circuit board.

4. The assembly of claim 1, wherein the chip is a T/R module which operates at frequencies greater than 6 Ghz.

5. The assembly of claim 1, further comprising:
   underfill between at least a portion of the chip and the circuit board.

6. The assembly of claim 5, wherein the underfill comprises epoxy.

7. A circuit comprising:
   a plurality of contact pads;
   a circuit board on which the plurality of contact pads are disposed, the circuit board comprising RF traces;
   a transmit/receive chip comprising a plurality of connection portions for connecting with corresponding contact pads of the plurality of contact pads;
   a fillet bond between the circuit board and the chip around at least a portion of the chip, wherein the fillet bond is not applied over RF traces on the board;
   a conductive medium making RF, digital and DC power connections between at least some of the plurality of connection portions and respective, corresponding contact pads.

8. The circuit according to claim 7, wherein the conductive medium comprises one of electrically conductive adhesive or solder.

9. The circuit according to claim 7, wherein the conductive medium comprises an anisotropically conductive film.

10. The circuit according to claim 7, wherein at least one of the plurality of connection portions is connected to a corresponding at least one of the plurality of contact pads by one of a pressure or thermosonic contact.

11. The circuit according to claim 7, further comprising an epoxy underfill between the chip and the circuit board.

12. The circuit according to claim 7, wherein the chip is a high frequency module.

13. The circuit according to claim 7, wherein the fillet bond comprises non-conductive adhesive.

14. The circuit according to claim 13, wherein the non-conductive adhesive has a high viscosity.

15. The circuit according to claim 7, wherein the fillet bond has a high flexure modulus.

16. The circuit according to claim 7, wherein the fillet bond extends up an edge of the chip between 50% and 100% of a thickness of the edge of the chip.

17. The circuit according to claim 7, wherein the fillet bond extends around a portion of the perimeter of the chip.

18. The circuit according to claim 17, further comprising an epoxy underfill.

* * * * *